(12) United States Patent
Zhang et al.

(10) Patent No.: US 9,385,098 B2
(45) Date of Patent: Jul. 5, 2016

(54) VARIABLE-SIZE SOLDER BUMP STRUCTURES FOR INTEGRATED CIRCUIT PACKAGING

(71) Applicant: NVIDIA CORPORATION, Santa Clara, CA (US)

(72) Inventors: Leilei Zhang, Sunnyvale, CA (US); Zuhair Bokharey, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/683,315

(22) Filed: Nov. 21, 2012

(65) Prior Publication Data

US 2014/0138823 A1   May 22, 2014

(51) Int. Cl.
| | | |
|---|---|---|
| H01L 23/00 | (2006.01) | |
| H01L 21/66 | (2006.01) | |
| H01L 23/498 | (2006.01) | |
| H05K 3/34 | (2006.01) | |
| H01L 21/56 | (2006.01) | |

(52) U.S. Cl.
CPC .............. *H01L 24/17* (2013.01); *H01L 22/12* (2013.01); *H01L 22/20* (2013.01); *H01L 23/49811* (2013.01); *H01L 23/49816* (2013.01); *H01L 24/14* (2013.01); *H01L 24/81* (2013.01); *H01L 21/563* (2013.01); *H01L 24/13* (2013.01); *H01L 24/16* (2013.01); *H01L 2224/131* (2013.01); *H01L 2224/1403* (2013.01); *H01L 2224/16225* (2013.01); *H01L 2224/73204* (2013.01); *H01L 2224/81048* (2013.01); *H01L 2224/81815* (2013.01); *H01L 2224/831* (2013.01); *H01L 2924/07802* (2013.01); *H01L 2924/15311* (2013.01); *H01L 2924/3511* (2013.01); *H05K 3/3436* (2013.01); *H05K 2201/10674* (2013.01)

(58) Field of Classification Search
CPC ......... H01L 24/17; H01L 22/12; H01L 22/20; H01L 23/49811; H01L 23/49816; H01L 24/14; H01L 2924/3511; H01L 24/81
USPC ......... 257/738, 737, 734, 777, 778, 686, 685, 257/723, 724, 728, E23.02, 784, 786, 257/E25.001, E23.023, E23.069, 780, 781, 257/782, 783; 438/5
See application file for complete search history.

(56) References Cited

U.S. PATENT DOCUMENTS

| | | | | |
|---|---|---|---|---|
| 4,897,918 | A * | 2/1990 | Osaka et al. | 29/830 |
| 5,641,946 | A * | 6/1997 | Shim | 174/261 |
| 6,043,990 | A * | 3/2000 | Johnson | H05K 3/3436 228/180.22 |
| 6,750,549 | B1 * | 6/2004 | Chandran et al. | 257/780 |
| 6,816,385 | B1 * | 11/2004 | Alcoe | 361/767 |
| 7,407,877 | B2 * | 8/2008 | Kweon et al. | 438/612 |
| 8,152,048 | B2 * | 4/2012 | Zu | 228/245 |
| 8,299,596 | B2 * | 10/2012 | Huang et al. | 257/686 |
| 8,397,380 | B2 * | 3/2013 | Kao et al. | 29/840 |
| 8,405,231 | B2 * | 3/2013 | Hayashi | 257/786 |
| 8,633,592 | B2 * | 1/2014 | Lee et al. | 257/762 |

(Continued)

*Primary Examiner* — Alexander Oscar Williams
(74) *Attorney, Agent, or Firm* — Artegis Law Group, LLP

(57) ABSTRACT

An integrated circuit package is described including a substrate, an integrated circuit die, a first plurality of solder bump structures, and a first plurality of variable-size solder bump structures. The first plurality of solder bump structures electrically couple the integrated circuit die to the substrate. The first plurality of variable-size solder bump structures are disposed on a bottom surface of the substrate. The first plurality of variable-size solder bump structures are sized to be substantially coplanar with a seating plane of the integrated circuit package.

15 Claims, 5 Drawing Sheets

(56) References Cited

U.S. PATENT DOCUMENTS

| | | | |
|---|---|---|---|
| 9,076,762 B2* | 7/2015 | Tsai | H01L 23/485 |
| 2001/0037565 A1* | 11/2001 | Prasad | H01L 21/4857 |
| | | | 29/832 |
| 2001/0046129 A1* | 11/2001 | Broglia et al. | 361/803 |
| 2002/0017709 A1* | 2/2002 | Yanagisawa et al. | 257/686 |
| 2002/0030261 A1* | 3/2002 | Rolda et al. | 257/685 |
| 2003/0122228 A1* | 7/2003 | Nagase | H01L 23/66 |
| | | | 257/678 |
| 2003/0156396 A1* | 8/2003 | Pearson et al. | 361/767 |
| 2004/0124540 A1* | 7/2004 | Chen et al. | 257/777 |
| 2005/0181544 A1* | 8/2005 | Haba et al. | 438/127 |
| 2005/0285246 A1* | 12/2005 | Haba | H01L 23/3128 |
| | | | 257/678 |
| 2006/0027921 A1* | 2/2006 | Chiu | H01L 23/10 |
| | | | 257/738 |
| 2006/0138647 A1* | 6/2006 | Crisp | H01L 24/73 |
| | | | 257/723 |
| 2006/0199310 A1* | 9/2006 | Nakabayashi et al. | 438/128 |
| 2006/0249857 A1* | 11/2006 | Haba | G01R 1/0483 |
| | | | 257/787 |
| 2007/0152350 A1* | 7/2007 | Kim et al. | 257/786 |
| 2007/0164445 A1* | 7/2007 | Ejima | H01L 23/3128 |
| | | | 257/777 |
| 2007/0230130 A1* | 10/2007 | Alcoe | H01L 23/3735 |
| | | | 361/704 |
| 2007/0246811 A1* | 10/2007 | Tsai | H01L 25/50 |
| | | | 257/678 |
| 2008/0054455 A1* | 3/2008 | Tsao et al. | 257/737 |
| 2008/0088033 A1* | 4/2008 | Humpston | H01L 23/49811 |
| | | | 257/778 |
| 2008/0150135 A1* | 6/2008 | Oyama et al. | 257/738 |
| 2008/0274569 A1* | 11/2008 | Tsao et al. | 438/16 |
| 2009/0039490 A1* | 2/2009 | Fan | 257/686 |
| 2009/0045510 A1* | 2/2009 | Naya | 257/737 |
| 2009/0065943 A1* | 3/2009 | Rothman | H01L 23/10 |
| | | | 257/772 |
| 2009/0302468 A1* | 12/2009 | Baek | H05K 3/3436 |
| | | | 257/738 |
| 2010/0143656 A1* | 6/2010 | Zu | B23K 3/0638 |
| | | | 428/172 |
| 2010/0171205 A1* | 7/2010 | Chen | H01L 21/565 |
| | | | 257/686 |
| 2010/0171207 A1* | 7/2010 | Shen | H01L 21/4853 |
| | | | 257/686 |
| 2010/0302749 A1* | 12/2010 | Kao et al. | 361/783 |
| 2011/0037156 A1* | 2/2011 | Chandrasekaran et al. | 257/686 |
| 2011/0100692 A1* | 5/2011 | Topacio et al. | 174/260 |
| 2011/0117700 A1* | 5/2011 | Weng | H01L 21/56 |
| | | | 438/109 |
| 2011/0233771 A1* | 9/2011 | Kwon | H01L 25/00 |
| | | | 257/737 |
| 2011/0248398 A1* | 10/2011 | Parvarandeh et al. | 257/737 |
| 2011/0298119 A1* | 12/2011 | Cho | H01L 23/3218 |
| | | | 257/686 |
| 2012/0007232 A1* | 1/2012 | Haba | H01L 21/4853 |
| | | | 257/737 |
| 2012/0020040 A1* | 1/2012 | Lin | H01L 25/0652 |
| | | | 361/772 |
| 2012/0091597 A1* | 4/2012 | Kwon | H01L 23/49838 |
| | | | 257/777 |
| 2012/0104595 A1* | 5/2012 | Haba | H01L 21/563 |
| | | | 257/737 |
| 2012/0146241 A1* | 6/2012 | Huang et al. | 257/777 |
| 2012/0193778 A1* | 8/2012 | Mawatari | H01L 23/3128 |
| | | | 257/737 |
| 2012/0327574 A1* | 12/2012 | Sakaguchi | H05K 1/181 |
| | | | 361/679.01 |
| 2013/0143361 A1* | 6/2013 | Lin | H01L 21/6835 |
| | | | 438/110 |
| 2013/0234318 A1* | 9/2013 | Lee | H01L 24/81 |
| | | | 257/737 |
| 2013/0277830 A1* | 10/2013 | Yu | H01L 24/16 |
| | | | 257/737 |
| 2014/0035131 A1* | 2/2014 | Noh | H01L 23/49811 |
| | | | 257/737 |
| 2014/0117554 A1* | 5/2014 | Uehling et al. | 257/773 |
| 2014/0167255 A1* | 6/2014 | Shaue | H01L 23/49811 |
| | | | 257/737 |
| 2014/0291843 A1* | 10/2014 | Jiang | H01L 23/49816 |
| | | | 257/738 |
| 2014/0299986 A1* | 10/2014 | Sakurai | H01L 24/13 |
| | | | 257/737 |
| 2015/0206832 A1* | 7/2015 | Kudo | H01L 23/49816 |
| | | | 257/676 |

* cited by examiner

VARIABLE-SIZE SOLDER BUMP STRUCTURES FOR INTEGRATED CIRCUIT PACKAGING

BACKGROUND OF THE INVENTION

1. Field of the Invention

Embodiments of the present invention generally relate to fabricating and surface mounting integrated circuit packages.

2. Description of the Related Art

Integrated circuit (IC) fabrication is a multi-step sequence which includes processes such as patterning, deposition, etching, and metallization. Typically, in the final processing steps, the resulting IC die are separated and packaged. IC packaging serves several purposes, including providing an electrical interface with the die, providing a thermal medium through which heat may be removed from the die, and/or providing mechanical protection for the die during subsequent usage and handling.

One type of IC packaging technique is referred to as "flip chip" packaging. In flip chip packaging, after the metallization process is complete, solder bump structures (e.g., solder balls, pads, etc.) are deposited on the die, and the die is separated from the wafer (e.g., via dicing, cutting, etc.). The die is then inverted and positioned on a substrate so that the solder bumps align with electrical connections formed on the substrate. Heat is applied via a solder reflow process to re-melt the solder bumps and attach the die to the substrate. The die/substrate assembly may further be underfilled with a non-conductive adhesive to strengthen the mechanical connection between the die and the substrate.

IC fabrication techniques have enabled the production of larger-sized die having higher and higher transistor densities. Consequently, IC packaging techniques have encountered challenges for providing packaging which supports the requisite number of electrical connections. In general, as the size of the die and number of electrical connections to the die is increased, the size of the package is increased. Further, as package size is increased, the thermal properties of the die and packaging materials become a more important factor.

One relevant thermal property of the die and packaging materials is the coefficient of thermal expansion (CTE). In flip chip packaging, for example, during the solder reflow process, the die is attached to the substrate at an elevated temperature. Upon cooling, a mismatch between the CTE of the die and the CTE of the substrate may cause the substrate to warp, reducing the planarity of the IC package and preventing electrical connections from being formed with the IC package. Additionally, warping of the IC package may affect the electrical connections provided between the die and the substrate. Moreover, IC packages which experience significant warping may be discarded for being outside of specification requirements.

Accordingly, there is a need in the art for a more effective way of compensating for a CTE mismatch between an IC die and other components of the IC packaging.

SUMMARY OF THE INVENTION

One embodiment of the present invention sets forth an integrated circuit package including a substrate, an integrated circuit die, a first plurality of solder bump structures, and a first plurality of variable-size solder bump structures. The first plurality of solder bump structures electrically couple the integrated circuit die to the substrate. The first plurality of variable-size solder bump structures are disposed on a bottom surface of the substrate. The first plurality of variable-size solder bump structures are sized to be substantially coplanar with a seating plane of the integrated circuit package.

Further embodiments provide a method for fabricating an integrated circuit package and a method for surface mounting an integrated circuit package.

One advantage of the disclosed technique is that variable-size solder bump structures and variable solder paste volumes may be utilized to salvage IC packages which would otherwise be discarded as being outside of a coplanarity specification. The coplanarity of these IC packages may be corrected, and the resulting IC package may be successfully surface mounted to a circuit board or other type of substrate, improving IC package yields.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of embodiments of the present invention. However, it will be apparent to one of skill in the art that embodiments of the present invention may be practiced without one or more of these specific details.

Figure 1A:
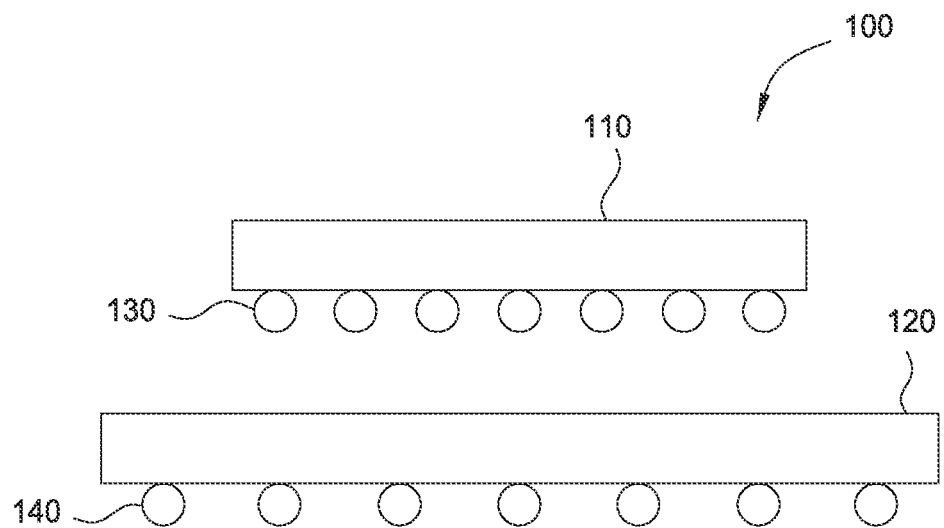
FIGS. 1A and 1B illustrate schematic views of a conventional integrated circuit package having a conventional configuration.
Figure 1B:
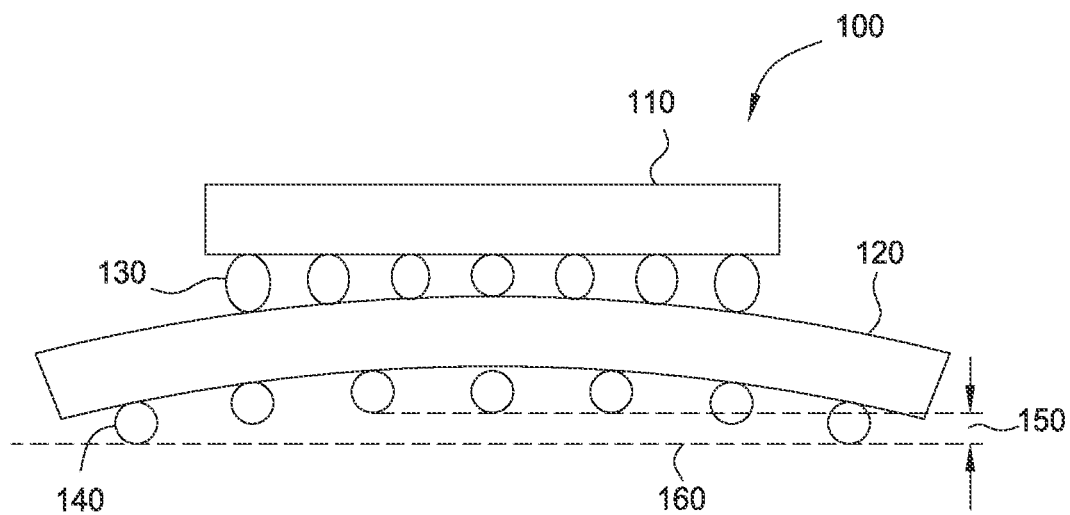

FIGS. 1A and 1B illustrate schematic views of an integrated circuit (IC) package 100 having a conventional configuration. The conventional IC package 100 includes a die 110, a substrate 120, a first plurality of solder balls 130, and a second plurality of solder balls 140. The first plurality of solder balls 130 mechanically and electrically couple the die 110 to the substrate 120 and provide electrical connections between the die 110 and the substrate 120. The second plurality of solder balls 140 mechanically and electrically couple the conventional IC package 100 to a circuit board (not shown) and provide electrical connections between the conventional IC package 100 and the circuit board.

FIG. 1A illustrates the conventional IC package 100 prior to bonding the die 110 to the substrate 120 with the first plurality of solder balls 130. In conventional "flip chip" configurations, the conventional IC package 100 utilizes solder balls 130, 140 of a uniform size. During bonding, the first plurality of solder balls 130 is positioned between the die 110 and the substrate 120, and the die 110 and the substrate 120 are heated to a similar temperature. The die 110 is then lowered onto the substrate 120, mechanically and electrically coupling the die 110 to the substrate 120.

FIG. 1B illustrates the conventional IC package 100 when cooled to room temperature (e.g., about 23° C.). Due to a mismatch between the coefficient of thermal expansion (CTE) of the die 110 and the CTE of the substrate 120, the substrate 120 and/or the die 110 experience warping when the conventional IC package 100 is cooled. As a result, the coplanarity 150 of the second plurality of solder balls 140 bonded to the bottom surface of the substrate 120 is reduced, as illustrated in FIG. 1B.

Coplanarity is a term used to describe the degree to which objects lie in the same plane. As the term is used in the field of IC packaging, coplanarity may be defined as the difference between the height of the highest solder ball and the height of the seating plane 160. For example, as shown in FIG. 1B, the coplanarity 150 of the conventional IC package 100 is determined by the difference between the height of the center solder ball 140 and the height of the seating plane 160 upon which the rightmost and leftmost solder balls 140 lie. An increase in the height of a solder ball above the seating plane 160 represents a decrease in coplanarity. Additionally, a decrease in coplanarity may prevent one or more solder balls from forming a proper mechanical and/or electrical connection with the substrate or circuit board on which the conventional IC package 100 is to be mounted. Moreover, because IC package coplanarity is typically required to meet certain requirements in order to ensure proper mechanical and electrical connectivity with other device components, a significant decrease in coplanarity may decrease IC package assembly yields.

Figure 2A:
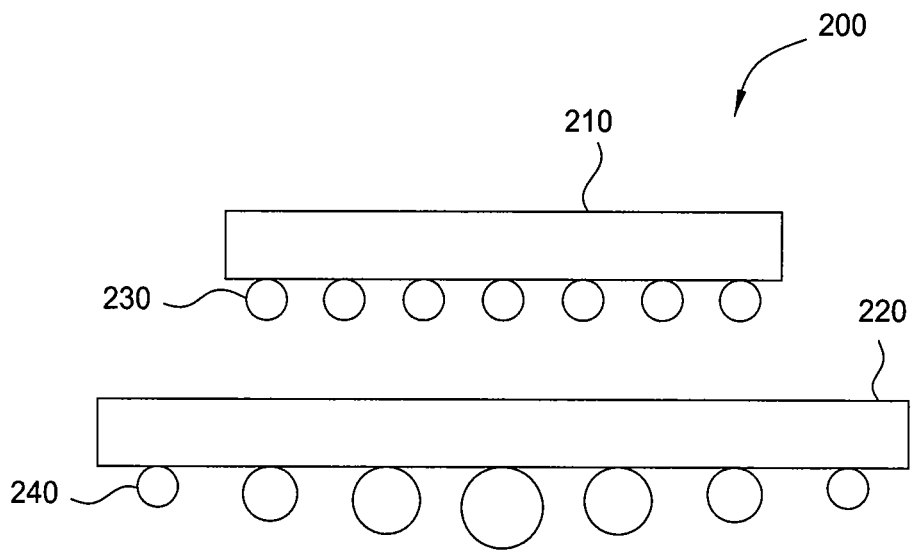
FIGS. 2A and 2B illustrate an integrated circuit package having variable-size solder bump structures, according to an embodiment of the present invention.
Figure 2B:
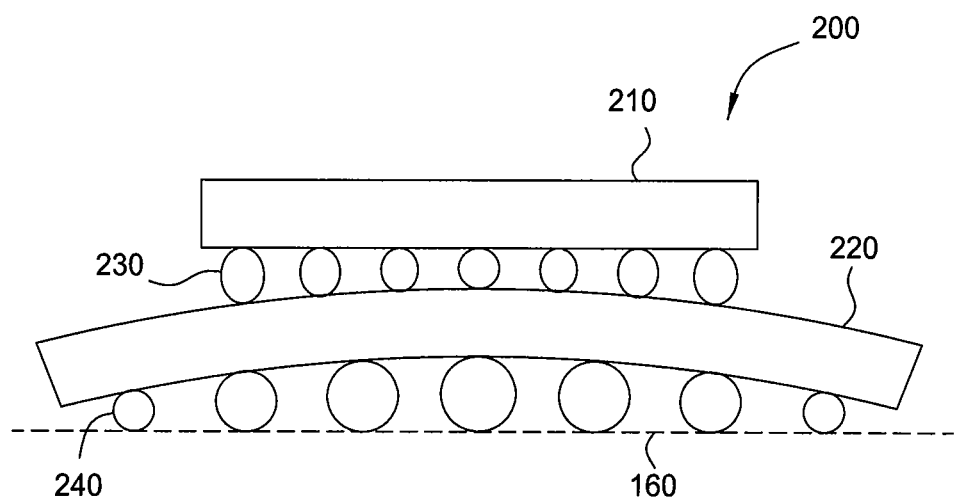

FIGS. 2A and 2B illustrate an integrated circuit (IC) package 200 having variable-size solder bump structures 240 according to an embodiment of the present invention. The IC package 200 includes an IC die 210, a substrate 220, a plurality of solder bump structures 230, and a plurality of variable-size solder bump structures 240.

FIG. 2A illustrates the IC package 200 prior to bonding the IC die 210 to the substrate 220 with the plurality of solder bump structures 230. During bonding, the first plurality of solder bump structures 230 are positioned between the IC die 210 and the substrate 220, and the IC die 210 and the substrate 220 are heated to a similar temperature. The IC die 210 is then lowered onto the substrate 220, mechanically and electrically coupling the IC die 210 to the substrate 220.

FIG. 2B illustrates the IC package 200 when cooled to room temperature (e.g., about 23° C.). Due to the mismatch between the CTE of the die 210 and the CTE of the substrate 220, the substrate 220 and/or the IC die 210 experience warping when the IC package 200 is cooled. However, this warping may be corrected by coupling a plurality of variable-size solder bump structures 240 to the bottom surface of the substrate 220. As shown in FIG. 2B, smaller solder bump structures 240 may be coupled near the edges of the substrate 220, while larger solder bump structure 240 may be coupled near the center of the substrate 220. This configuration may increase the coplanarity of the solder bump structures 240 of the resulting IC package 200.

Although FIGS. 2A and 2B illustrate bonding the variable-size solder bump structures 240 to the bottom surface of the substrate 220 prior to bonding the IC die 210 to the substrate 220, the variable-size solder bump structures 240 may be bonded to the substrate at any point in the packaging process. For example, the variable-size solder bump structures 240 may be bonded to the substrate after the IC die 210 has been bonded to the substrate 220, such as after the IC die 210 and substrate 220 have cooled. Allowing the IC die 210 and substrate 220 to cool prior to bonding the variable-size solder bump structures 240 may enable more accurate planarity correction, since the size and/or placement of the variable-size solder bump structures 240 can be more accurately determined after substrate warping has taken place.

In other embodiments, the variable-size solder bump structures 240 may be bonded to the substrate 220 when surface mounting the IC package 200 on a second substrate (e.g., a printed circuit board, interposer, and the like). In such embodiments, the size and/or placement of the variable-size solder bump structures 240 may then be selected to ensure proper electrical and mechanical connections are formed between the IC package 200 and the second substrate.

In addition to bonding the IC die 210 to the substrate 220, the IC die 210 may be underfilled and/or overmolded to enhance the mechanical connections between the IC die 210 and the substrate 220. Further, in addition to surface mounting the IC package 200 on a second substrate, the IC package 200 may be underfilled and/or overmolded to enhance the mechanical connections between the IC package 200 and the second substrate.

Although not illustrated in FIGS. 2A and 2B, the sizes of the plurality of solder bump structures 230 coupled between the IC die 210 and the substrate 220 also may be varied in order to ensure proper electrical and mechanical connectivity between the IC die 210 and the substrate 220. However, in contrast to the configuration of the plurality of variable-size solder bump structures 240, the sizes of the plurality of solder bump structures 230 may be selected such that larger solder bump structures are disposed near the edges of the IC die 210, while smaller solder bump structure are disposed near the center of the IC die 210.

Solder bump pitch may be defined as the center-to-center distance between adjacent solder balls. In general, any solder bump size and pitch may be used to improve the coplanarity of the IC package 200 when bonding the solder bump structures 230, 240 to the IC die 210 and substrate 220. The variable-size solder bump structures may include multiple sizes (e.g., two different sizes, three different sizes, or more). Examples of solder bump structures include, without limitation, solder balls, solder pads, and pillar bumps (e.g., copper pillar bumps). The IC die 210 may be any type of electronic circuit capable of being packaged. Examples of IC die include, without limitation, central processing unit (CPU) die, system-on-chip (SoC) die, microcontroller die, volatile memory die (e.g., dynamic random-access memory (DRAM) die, DRAM cubes), non-volatile memory die (e.g., flash memory, magnetoresistive RAM), and the like. The substrate 220 may be any type of substrate capable of being used for packaging integrated circuits. Examples of substrates include, without limitation, interposers, dielectric carriers (e.g., ceramics, glass), printed circuit boards, semiconductor wafers, and the like.

Figure 3A:
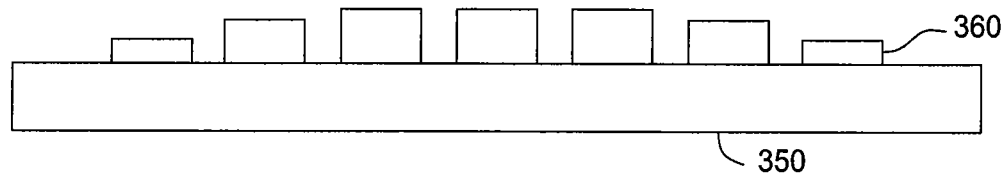
FIGS. 3A and 3B illustrate an integrated circuit package disposed on variable solder paste volumes applied to a circuit board according to an embodiment of the present invention.
Figure 3B:
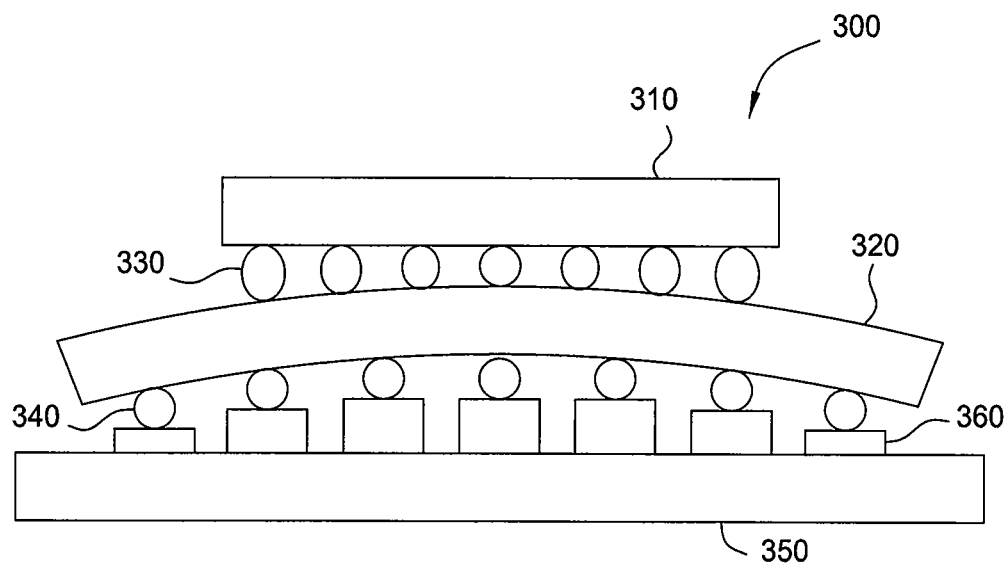

FIGS. 3A and 3B illustrate an IC package 300 disposed on variable solder paste volumes 360 applied to a circuit board 350 according to an embodiment of the present invention. The IC package 300 includes an IC die 310, a substrate 320, a first plurality of solder bump structures 330, and a second plurality of solder bump structures 340. As discussed above with respect to FIG. 2B, during cooling of the IC package 300, a mismatch between the CTE of the IC die 310 and the CTE of the substrate 320 leads to warping of the IC package 300. Accordingly, as shown in FIG. 3B, the variable solder pastes volumes 360 are selected to match the heights of the second plurality of solder bump structures 340 and compensate for the loss of coplanarity of the IC package 300. Consequently, IC packages (e.g., IC package 300) which would otherwise be discarded as being outside of a coplanarity specification may be salvaged and successfully surface mounted to a circuit board 350 or other type of substrate.

In general, the volume and height of the solder paste disposed on the circuit board 350 is higher near the middle of the circuit board 350 and lower near the edges of the circuit board 350. Although FIG. 3A illustrates disposing the variable solder paste volumes 360 on the circuit board 350 prior to surface mounting the IC package 300 to the circuit board, the variable solder paste volumes 360 may be applied in other ways. For example, the variable solder paste volumes 360 may be applied directly to the second plurality of solder bump structures 340. The resulting IC package 300 then may be surface mounted on the circuit board 350. Additionally, although pillar-shaped variable solder paste volumes 360 are illustrated, any solder paste size, solder paste shape, and solder paste pitch may be used.

In other embodiments, the techniques illustrated in FIGS. 2A and 2B may be combined with the techniques illustrated in FIGS. 3A and 3B. For example, variable-size solder bump structures may be used in conjunction with variable solder paste volumes to correct IC package coplanarity and ensure proper electrical and mechanical connectivity when surface mounting an IC package to a circuit board or other type of substrate. As an example, such combination techniques may be used when, after the application of variable-size solder bump structures, the coplanarity of an IC package remains outside of a specification requirement. In such an example, variable solder paste volumes may be applied to a circuit board or other type of substrate, or to an IC package, to correct remaining deficiencies. In still other embodiments, variable solder paste volumes (and/or variable-size solder bump structures) may be disposed between the IC die 310 and the substrate 320 to ensure proper electrical and mechanical connectivity.

Figure 4:
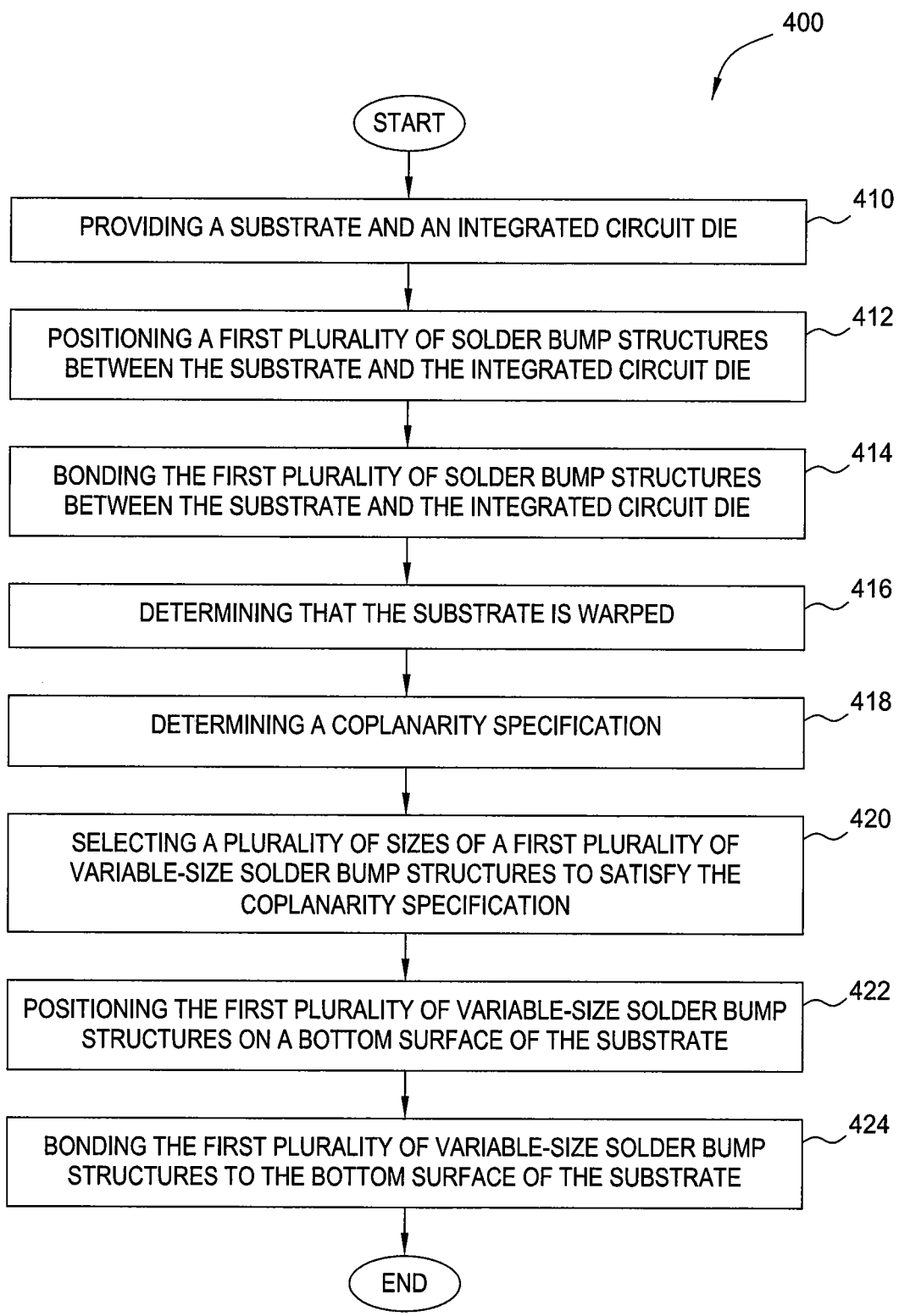
FIG. 4 is a flow diagram illustrating a method for fabricating an integrated circuit package according to an embodiment of the present invention.

FIG. 4 is a flow diagram illustrating a method for fabricating an integrated circuit package 200 according to an embodiment of the present invention. Although the method steps are described in conjunction with the exemplary embodiments illustrated in FIGS. 2A and 2B, other variations will be apparent to persons of ordinary skill in the art.

At step 410, a substrate 220 and an IC die 210 are provided. At step 412, a first plurality of solder bump structures 230 are positioned between the IC die 210 and the substrate 220. At step 414, the first plurality of solder bump structures 230 are bonded between the IC die 210 and the substrate 220. Bonding may be performed by increasing the temperature of the IC die 210 and substrate 220 to a solder reflow temperature of about 150° C. to about 300° C., such as about 200° C. to about 250° C.

After bonding the IC die 210 to the substrate 220, the resulting assembly may be cooled (e.g., to room temperature). During cooling, a mismatch between the CTE of the IC die 210 and the CTE of the substrate 220 may cause the size of these components to decrease at different rates. As a result, after cooling, one or both of the IC die 210 and the substrate 220 may warp. For example, if the CTE of the substrate 220 is higher than the CTE of the IC die 210, the substrate 220 may warp during cooling. In order to compensate for warping of the IC die 210 and/or substrate 220 and ensure that the solder bump structures coupled to the bottom surface of the substrate 220 are within a coplanarity specification, several steps may be taken. First, at step 416, it is first determined whether the substrate 220 is warped. Determining whether the substrate 220 is warped may include, for example, examining the substrate 220 and/or calculating a measure of warping based on the CTE of the IC die 210 and the CTE of the substrate 220. Next, at step 418, a coplanarity specification may be determined. The coplanarity specification may include a specified distance between the height of the highest solder bump structure and the height of the seating plane 160. When the height of the highest solder bump structure is greater than the specified distance from the height of the seating plane 160, the solder bump structure may be considered to be outside of the coplanarity specification. When the height of the highest solder bump structure is less than the specified distance from the height of the seating plane 160, the solder bump structure may be considered to be within the coplanarity specification.

At step 420, a first plurality of variable-size solder bump structures 240 are selected. The sizes of the first plurality of variable-size solder bump structures 240 may be selected so that the first plurality of variable-size solder bump structures 240 satisfy the coplanarity specification when the first plurality of variable-size solder bump structures 240 are bonded to the bottom surface of the substrate 220. At step 422, the plurality of variable-size solder bump structures 240 are positioned on a bottom surface of the substrate 220. For example, the plurality of variable-size solder bump structures 240 may be positioned such that the larger variable-size solder bump structures 240 are near the center of the substrate 220 and the smaller variable-size solder bump structures 240 are near the edges of the substrate 220.

The size of the variable-size solder bump structures 240 may be selected in any manner configured to correct or compensate for the coplanarity of the substrate 220 and/or resulting IC package 200. Additionally, the pitch (i.e., the center-to-center distance between solder bump structures) may be selected in any manner configured to correct or compensate for the coplanarity of the substrate 220 and/or resulting IC package 200. Moreover, the pitch of the variable-size solder bump structures 240 may be constant, or the pitch may vary with substrate 220 location. Finally, at step 424, the plurality of variable-size solder bump structures 240 are bonded to the bottom surface of the substrate 220.

Figure 5:
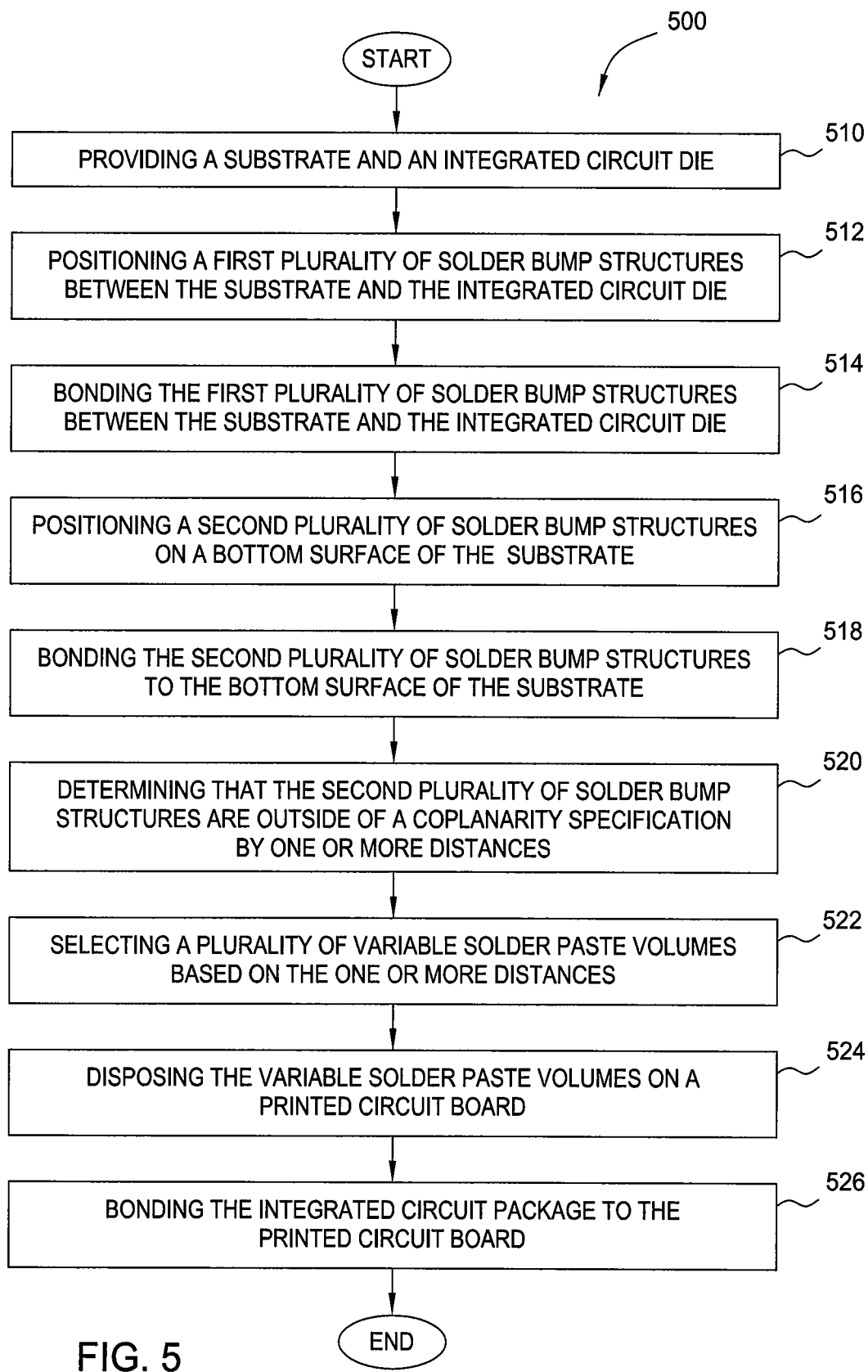
FIG. 5 is a flow diagram illustrating a method for surface mounting an integrated circuit package according to an embodiment of the present invention.

FIG. 5 is a flow diagram illustrating a method for surface mounting an integrated circuit package 300 according to an embodiment of the present invention. Although the method steps are described in conjunction with the exemplary embodiments illustrated in FIGS. 3A and 3B, other variations will be apparent to persons of ordinary skill in the art.

At step 510, a substrate 320 and an IC die 310 are provided. At step 512, a first plurality of solder bump structures 330 are positioned between the IC die 310 and the substrate 320. At step 514, the first plurality of solder bump structures 330 are bonded between the IC die 310 and the substrate 320. As discussed with respect to FIG. 4, after bonding the IC die 310 to the substrate 320, one or both of the IC die 310 and the substrate 320 may experience warping.

Warping of the IC die 310 and/or the substrate 320 may be account for in one or more ways. At step 516, a second plurality of solder bump structures 340 are positioned on a bottom surface of the substrate 320. The second plurality of solder bump structures 340 may be of a uniform size and shape, or the second plurality of solder bump structures 340 may be of different sizes and shapes, as described above with respect to FIGS. 2A, 2B and 4. At step 518, the second plurality of solder bump structures 340 are bonded to the bottom surface of the substrate 320. Next, at step 520, it is determined whether the second plurality of solder bump structures 340 are outside of a coplanarity specification. Further, the distance(s) by which the second plurality of solder bump structures 340 are outside of the coplanarity specification may be determined. In one example, if warping of the substrate 320 occurs and the second plurality of solder bump structures 340 are of a uniform size, the second plurality of solder bump structures 340 may be outside of a coplanarity specification. In another example, if the second plurality of solder bump structures 340 are selected to be a plurality of different sizes and/or shapes, the second plurality of solder bump structures 340 still may fall outside of the coplanarity specification. In either example, additional steps may be taken to ensure that the second plurality of solder bump structures 340 are able to form proper electrical and mechanical connections with a circuit board 350 or other type of substrate on which they are disposed.

At step 522, a plurality of solder paste volumes 360 may be selected based on the distance(s) by which the second plurality of solder bump structures are outside of the coplanarity specification. The plurality of solder paste volumes 360 may be selected to compensate for coplanarity deficiencies of the second plurality of solder bump structures 340. For example, a larger solder paste volume may be selected for a solder bump structure that is high above the seating plane (low measure of coplanarity), while a smaller solder paste volume may be selected for a solder bump structure that is closer to the seating plane (higher measure of coplanarity). At step 524, the plurality of variable solder paste volumes 360 are disposed on the circuit board 350 or other type of substrate as described above with respect to FIGS. 3A and 3B. Finally, at step 526, the IC package 300 is disposed on and/or bonded to the circuit board 350 or other type of substrate, for example, by bonding the second plurality of solder bump structures 340 to the plurality of solder paste volumes 360.

In sum, the surface mount technique uses solder bump structures (e.g., solder balls) of varying sizes to compensate for curvature of the IC die, substrate, and/or other packaging materials. The size of the solder bump structures may be varied to ensure proper electrical connectivity when attaching the die to the IC package and/or when attaching the resulting IC package to a circuit board. Furthermore, when attaching the IC package to a circuit board, solder paste may be deposited on a circuit board at varying volumes to compensate for the coplanarity of the IC package.

One advantage of the disclosed technique is that variable-size solder bump structures and variable solder paste volumes may be utilized to salvage IC packages which would otherwise be discarded as being outside of a coplanarity specification. The coplanarity of these IC packages may be corrected, and the resulting IC package may be successfully surface mounted to a circuit board or other type of substrate, improving IC package yields.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What is claimed:

1. An integrated circuit package comprising:
    a first substrate;
    an integrated circuit die;
    a first plurality of solder bump structures electrically coupling the integrated circuit die to the first substrate;
    a first plurality of variable-size solder bump structures disposed on a bottom surface of the first substrate;
    a second substrate; and
    a plurality of variable solder paste volumes extending at different heights above a top surface of the second substrate.

2. The integrated circuit package of claim 1, wherein:
    the first plurality of variable-size solder bump structures comprise large solder bump structures and small solder bump structures,
    the large solder bump structures are disposed near a center point of the first substrate, and
    the small solder bump structures are disposed near one or more edges of the first substrate.

3. The integrated circuit package of claim 1, wherein the first plurality of variable-size solder bump structures are sized to be substantially coplanar with a seating plane of the integrated circuit package.

4. The integrated circuit package of claim 1, wherein the first plurality of variable-size solder bump structures comprise three or more solder bump structure sizes.

5. The integrated circuit package of claim 1, wherein the first plurality of variable-size solder bump structures comprises at least one of solder balls, solder pads, and pillar bumps.

6. The integrated circuit package of claim 1, wherein:
    the first plurality of solder bump structures comprise large solder bump structures and small solder bump structures,
    the large solder bump structures are disposed near one or more edges of the integrated circuit die, and
    the small solder bump structures are disposed near a center point of the integrated circuit die.

7. The integrated circuit package of claim 1, wherein at least one of the first substrate and the second substrate comprises an interposer.

8. The integrated circuit package of claim 1, wherein the integrated circuit package comprises a ball grid array.

9. The integrated circuit package of claim 1, wherein each variable solder paste volume included in the plurality of variable solder paste volumes is coupled to a solder bump structure included in the first plurality of variable-size solder bump structures.

10. The integrated circuit package of claim 1, wherein the plurality of variable solder paste volumes are sized based on a plurality of distances from the first plurality of variable-size solder bump structures to the seating plane of the integrated circuit package.

11. An integrated circuit package comprising:
    a first substrate;
    an integrated circuit die;
    a first plurality of solder bump structures electrically coupling the integrated circuit die to the first substrate;
    a second plurality of solder bump structures disposed on a bottom surface of the first substrate;
    a second substrate; and
    a plurality of variable solder paste volumes extending at different heights above a top surface of the second substrate.

12. The integrated circuit package of claim 11, wherein the plurality of variable solder paste volumes are sized based a plurality of distances from the second plurality of solder bump structures to a seating plane of the integrated circuit package.

13. The integrated circuit package of claim 11, wherein each variable solder paste volume included in the plurality of variable solder paste volumes is coupled to a solder bump structure included in the second plurality of solder bump structures.

14. The integrated circuit package of claim 11, wherein at least one of the first substrate and the second substrate comprises an interposer.

15. The integrated circuit package of claim 11, wherein the integrated circuit package comprises a ball grid array.

* * * * *